(12) United States Patent
Lu

(10) Patent No.: US 10,854,527 B2
(45) Date of Patent: Dec. 1, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 127 days.

(21) Appl. No.: 15/990,210

(22) Filed: May 25, 2018

(65) Prior Publication Data
US 2019/0363064 A1 Nov. 28, 2019

(51) Int. Cl.
| | | |
|---|---|---|
| *H01L 23/31* | (2006.01) | |
| *H01L 23/00* | (2006.01) | |
| *H01L 21/48* | (2006.01) | |
| *H01L 21/56* | (2006.01) | |
| *H01L 23/498* | (2006.01) | |

(52) U.S. Cl.
CPC ........ *H01L 23/3135* (2013.01); *H01L 21/481* (2013.01); *H01L 21/4846* (2013.01); *H01L 21/56* (2013.01); *H01L 23/3128* (2013.01); *H01L 23/49822* (2013.01); *H01L 24/24* (2013.01); *H01L 24/25* (2013.01); *H01L 24/32* (2013.01); *H01L 24/82* (2013.01); *H01L 2224/24227* (2013.01); *H01L 2224/25171* (2013.01); *H01L 2224/32227* (2013.01); *H01L 2224/32237* (2013.01); *H01L 2224/73267* (2013.01); *H01L 2224/82005* (2013.01); *H01L 2224/82106* (2013.01)

(58) Field of Classification Search
CPC ............ H01L 23/3171; H01L 23/3718; H01L 23/3185; H01L 23/3192; H01L 23/3135; H01L 23/3314; H01L 23/3142; H01L 23/3128; H01L 23/49822; H01L 21/56; H01L 21/563; H01L 21/481; H01L 21/4846; H01L 24/24; H01L 24/32; H01L 24/25
See application file for complete search history.

(56) References Cited

U.S. PATENT DOCUMENTS

| | | | |
|---|---|---|---|
| 9,508,621 B2 | 11/2016 | Lin et al. | |
| 9,627,329 B1 | 4/2017 | Kwan et al. | |
| 2009/0087947 A1* | 4/2009 | Tong | .................. H01L 23/3135 438/108 |

(Continued)

*Primary Examiner* — Zandra V Smith
*Assistant Examiner* — Jeremy J Joy
(74) *Attorney, Agent, or Firm* — Foley & Lardner LLP

(57) ABSTRACT

A semiconductor device package includes a circuit layer, an electronic component, an electronic component, a first passivation layer and a second passivation layer. The circuit layer has a first surface. The electronic component is disposed on the first surface of the circuit layer. The first passivation layer is disposed on the first surface of the circuit layer. The first passivation layer has a first surface facing away the circuit layer. The second passivation layer is disposed on the first surface of the first passivation layer. The second passivation layer has a second surface facing away the circuit layer. A uniformity of the first surface of the first passivation layer is greater than a uniformity of the second surface of the second passivation layer.

13 Claims, 14 Drawing Sheets

(56) References Cited

U.S. PATENT DOCUMENTS

| | | | |
|---|---|---|---|
| 2012/0153493 A1 | 6/2012 | Lee et al. | |
| 2012/0313243 A1* | 12/2012 | Chang | H01L 23/3128 |
| | | | 257/738 |
| 2013/0113098 A1* | 5/2013 | Hwang | H01L 23/49816 |
| | | | 257/738 |
| 2014/0256092 A1* | 9/2014 | Kuo | H01L 23/3171 |
| | | | 438/124 |
| 2017/0005074 A1* | 1/2017 | Chen | H01L 21/568 |
| 2017/0117200 A1* | 4/2017 | Kim | H01L 21/485 |
| 2017/0207151 A1* | 7/2017 | Lu | H01L 23/3121 |
| 2017/0250091 A1* | 8/2017 | Yu | H01L 24/19 |
| 2018/0082933 A1* | 3/2018 | Ko | H01L 23/16 |
| 2018/0130760 A1* | 5/2018 | Wang | H01L 23/367 |
| 2018/0138115 A1* | 5/2018 | Lu | H01L 21/6835 |
| 2018/0204741 A1* | 7/2018 | Chew | H01L 24/24 |
| 2019/0080975 A1* | 3/2019 | Lee | H01L 24/13 |
| 2019/0131242 A1* | 5/2019 | Lee | H01L 23/49833 |
| 2019/0304862 A1* | 10/2019 | Lu | H01L 25/50 |

\* cited by examiner

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same. More particularly, the present disclosure relates to a semiconductor device package including a conductive pillar structure and a method of manufacturing the same.

2. Description of the Related Art

A semiconductor device package with a fan-out or fan-in structure can be formed by a face-up process or a face-down process. The current face-up process to form a fan-out structure may include the following operations: attaching a chip/die to a carrier; forming a plurality of conductive pillars on the active surface of the chip/die and on the carrier adjacent to the chip/die; forming a molding compound on the carrier to cover the chip/die and the conductive pillars; and performing a grinding process to remove a portion of the molding compound to expose the conductive pillars for the following process. However, the grinding process would increase the time and cost for manufacturing the fan-out structure.

SUMMARY

In one or more embodiments, a semiconductor device package includes a circuit layer, an electronic component, an electronic component, a first passivation layer and a second passivation layer. The circuit layer has a first surface. The electronic component is disposed on the first surface of the circuit layer. The first passivation layer is disposed on the first surface of the circuit layer. The first passivation layer has a first surface facing away the circuit layer. The second passivation layer is disposed on the first surface of the first passivation layer. The second passivation layer has a second surface facing away the circuit layer. A uniformity of the first surface of the first passivation layer is greater than a uniformity of the second surface of the second passivation layer.

In one or more embodiments, a semiconductor device package includes a circuit layer, an electronic component and a first passivation layer. The circuit layer has a first surface. The electronic component is disposed on the first surface of the circuit layer. The first passivation layer is disposed on the first surface of the circuit layer and covers a portion of the electronic component. The first passivation layer has a first surface facing away the circuit layer. A uniformity of the first surface of the first passivation layer is in a range from about 15% to about 30%.

In one or more embodiments, a method for manufacturing a semiconductor device package includes (a) forming a circuit layer; (b) disposing an electronic component on the circuit layer; (c) forming a first passivation layer on the circuit layer to cover a portion of the electronic component, the first passivation layer having a first surface facing away the circuit layer; and (d) forming a second passivation layer on the first passivation layer, the second passivation layer having a second surface facing away the circuit layer. A uniformity of the first surface of the first passivation layer is greater than a uniformity of the second surface of the second passivation layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
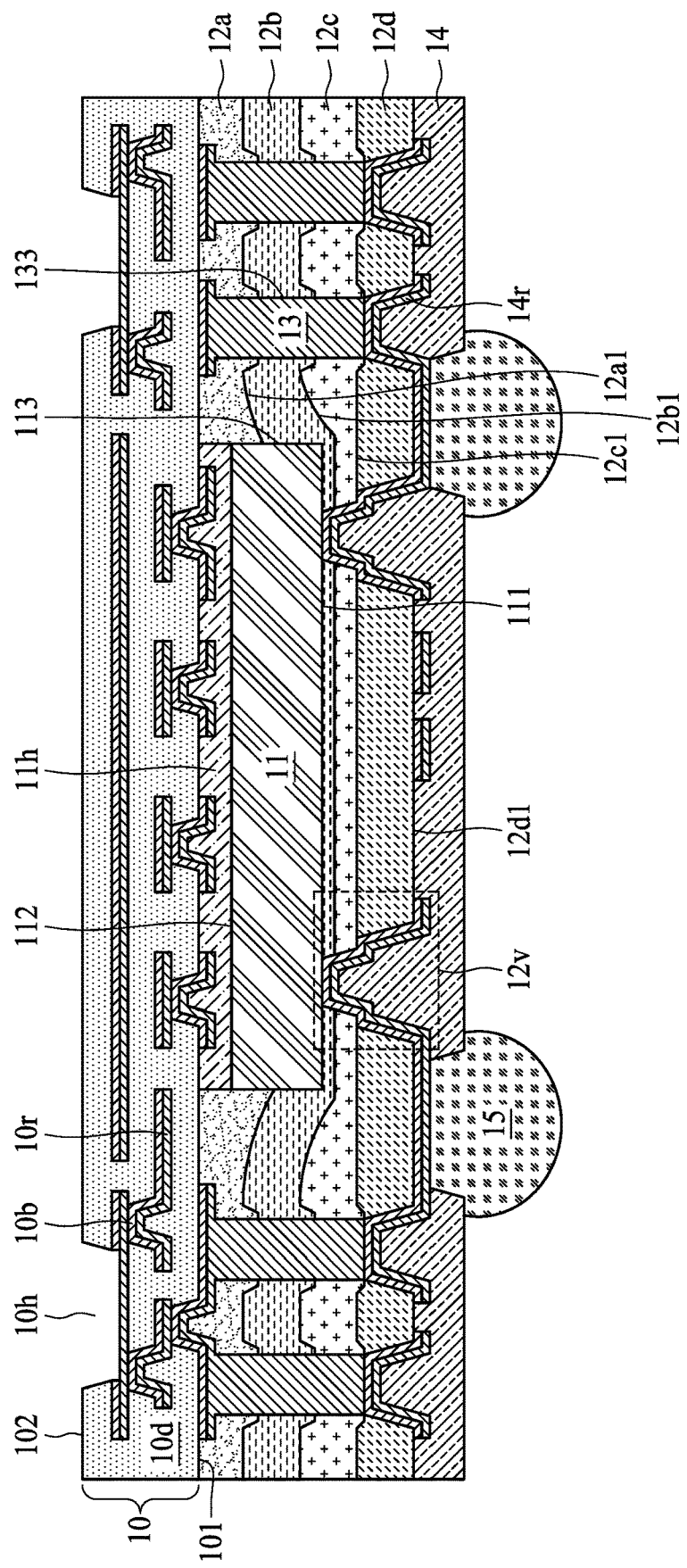
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a circuit layer 10, an electronic component 11, passivation layers 12a, 12b, 12c, 12d, a conductive pillar 13, a protection layer 14 and an electrical contact 15.

The circuit layer 10 includes a conductive layer (e.g., redistribution layer, RDL) 10r and a dielectric layer 10d. In some embodiments, the circuit layer 10 may include a barrier layer 10b. Alternatively, the barrier layer 10b can be omitted depending on different design specifications. A portion of the conductive layer 10r and the barrier layer 10b is covered or encapsulated by the dielectric layer 10d while another portion of the conductive layer 10r and the barrier layer 10b is exposed from the dielectric layer 10d to provide electrical connections for the electronic component 11. In some embodiments, the circuit layer 10 has a recess or cavity on a surface 102 thereof to expose a portion of the conductive layer 10r to provide electrical connections. In other embodiments, no recess or cavity is formed on the surface 102 of the circuit layer 10. In other embodiments, a top layer of the conductive layer 10r is fully exposed from the dielectric layer 10d. In some embodiments, a line space (L/S) of the conductive layer is equal to or less than 2 μm/2 μm.

In some embodiments, the dielectric layer 10d may include molding compounds, pre-impregnated composite fibers (e.g., pre-preg), Borophosphosilicate Glass (BPSG), silicon oxide, silicon nitride, silicon oxynitride, Undoped Silicate Glass (USG), glass, ceramic, any combination of two or more thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, there may be any number of conductive layers 10r depending on design specifications. In some embodiments, the conductive layer 10r is formed of or includes gold (Au), silver (Ag), copper (Cu), platinum (Pt), Palladium (Pd), other metal(s) or alloy(s), or a combination of two or more thereof. In some embodiments, the barrier layer 10b includes titanium (Ti), nickel (Ni), tungsten (W), other metal(s) or alloy(s), or a combination of two or more thereof.

The electronic component 11 is disposed on a surface 101 (also referred to as "a first surface") of the circuit layer 10. A backside surface 112 of the electronic component 11 is attached to the circuit layer 10 through an adhesive layer 11h (e.g., glue). In some embodiments, a chip backside layer may be disposed between the backside surface 112 and the adhesive layer 11h. In some embodiments, the chip backside layer may include Cu, Ni, Ti, W or Pt), other metal(s) or alloy(s), or a combination of two or more thereof. In some embodiments, the chip backside layer may include PI, ABF, epoxy, CPD or solder mask. The electronic component 11 may include a chip or a die including a semiconductor substrate, one or more integrated circuit devices, and/or one or more overlying interconnection structures disposed therein. The integrated circuit devices may include active devices such as transistors and/or passive devices such resistors, capacitors, inductors, or a combination of two or more thereof. In some embodiments, a thickness of the electronic component 11 is in a range from about 25 µm to 50 µm. In some embodiments, there may be any number of electronic components disposed on the surface 101 of the circuit layer 10 depending on design specifications.

The conductive pillar 13 is disposed on the surface 101 of the substrate circuit layer 10 and is electrically connected to the conductive layer 10r exposed from the dielectric layer 10d. The conductive pillar 13 is disposed adjacent to the electronic component 11 and spaced apart from the electronic component 11. In some embodiments, there are a plurality of conductive pillar 13 surrounding the electronic component 11. In some embodiments, a height of the conductive pillar 13 is greater than a thickness of the electronic component 11. Alternatively, the height of the conductive pillar 13 is equal to or less than the thickness of the electronic component 11. In some embodiments a diameter of the conductive pillar 13 is in a range from about 20 micrometer (µm) to about 30 µm. In some embodiments, a height of the conductive pillar 13 is equal to or greater than 150 µm.

The passivation layer 12a is disposed on the surface 101 of the circuit layer 10 and covers a portion of the electronic component 11. For example, a surface 12a1 of the passivation layer 12a is at or adjacent to a lateral surface 113 of the electronic component 11. For example, the surface 12a1 of the passivation layer 12a is not coplanar with an active surface 111 of the electronic component 11. For example, a distance between the active surface 111 of the electronic component 11 and the surface 101 of the circuit layer 10 is greater than a distance between the surface 12a1 of the passivation layer 12a and the surface 101 of the circuit layer 10. The passivation layer 12a also covers a portion of the conductive pillar 13. For example, the surface 12a1 of the passivation layer 12a is at or adjacent to a lateral surface 133 of the conductive pillar 13. For example, the height of the conductive pillar 13 is greater than a distance between the surface 12a1 of the passivation layer 12a and the surface 101 of the circuit layer 10. In some embodiments, a thickness of the passivation layer 12a is not uniform. For example, a thickness of a portion of the passivation layer 12a that is adjacent to the conductive pillar 13 is greater than a thickness of another portion of the passivation layer 12a that is far away from the conductive pillar 13. In some embodiments, a thickness of the passivation layer 12a is in a range from about 20 µm to about 60 µm.

The passivation layer 12b is disposed on the surface 12a1 of the passivation layer 12a. The passivation layer 12b covers the active surface 111 of the electronic component 11. For example, a distance between a surface 12b1 of the passivation layer 12b and the surface 101 of the circuit layer 10 is greater than the distance between the active surface 111 of the electronic component 11 and the surface 101 of the circuit layer 10. The passivation layer 12b also covers a portion of the conductive pillar 13. For example, the surface 12b1 of the passivation layer 12b is at or adjacent to a lateral surface 133 of the conductive pillar 13. For example, the height of the conductive pillar 13 is greater than the distance between the surface 12b1 of the passivation layer 12b and the surface 101 of the circuit layer 10. In some embodiments, a thickness of the passivation layer 12b is in a range from about 10 µm to about 50 µm.

The passivation layer 12c is disposed on the surface 12b1 of the passivation layer 12b. The passivation layer 12c covers a portion of the lateral surface 133 of the conductive pillar 13 that is exposed from the passivation layer 12a and the passivation layer 12b. For example, the lateral surface 133 of the conductive pillar 13 is fully covered by the passivation layer 12a, the passivation layer 12b and the passivation layer 12c. For example, the height of the conductive pillar 13 is substantially the same as a distance between a surface 12c1 of the passivation layer 12c and the surface 101 of the circuit layer 10. In some embodiments, a thickness of the passivation layer 12b is in a range from about 5 µm to about 40 µm. In other embodiments, the passivation layer 12c does not fully covered the conductive pillar 13. For example, the height of the conductive pillar 13 is greater than the distance of the surface 12c1 of the passivation layer 12c and the surface 101 of the circuit layer 10. In other embodiments, the height of the conductive pillar 13 is less than the distance of the surface 12c1 of the passivation layer 12c and the surface 101 of the circuit layer 10. For example, the surface 12c1 of the passivation layer 12c may define a recess to expose the conductive pillar.

In some embodiments, a uniformity of the surface 12a1 of the passivation layer 12a is greater than a uniformity of the surface 12b1 of the passivation layer 12b. In some embodiments, the uniformity of the surface 12b1 of the passivation layer 12b is greater than a uniformity of the surface 12c1 of the passivation layer 12c. For example, the uniformity of the surface 12a1 of the passivation layer 12a is in a range from about 20% to about 30%. For example, the uniformity of the surface 12b1 of the passivation layer 12b is in a range from about 10% to about 20%. For example, the uniformity of the surface 12c1 of the passivation layer 12c is in a range from about 2% to about 10%.

In some embodiments, a liquid viscosity of the passivation layer 12a is greater than a liquid viscosity of the passivation layer 12b or the passivation layer 12c. In some embodiments, the liquid viscosity of the passivation layer 12b is greater than the liquid viscosity of the passivation layer 12c. For example, the liquid viscosity of the passivation layer 12a is in a range from about 7 Pa·s to about 9 Pa·s. For example, the liquid viscosity of the passivation layer 12b is in a range from about 4 Pa·s to about 7 Pa·s. For example, the liquid viscosity of the passivation layer 12c is in a range from about 1 Pa·s to about 4 Pa·s.

In some embodiments, the passivation layer 12a, 12b or 12c may include photosensitive materials. In some embodiments, the passivation layer 12a, 12b or 12c may include silicon oxide, silicon nitride, gallium oxide, aluminum oxide, scandium oxide, zirconium oxide, lanthanum oxide, hafnium oxide, another oxide, another nitride, or a combination of two or more thereof. In some embodiments, the passivation layer 12a, 12b or 12c can be replaced by solder mask liquid (e.g., in an ink form) or film depending on specifications of various embodiments.

In some embodiments, the electronic component 11 and the conductive pillar 13 are covered by a molding compound. However, due to the CTE mismatch between the molding compound and the dielectric layer of the circuit layer, a warpage or crack may occur. In accordance with the embodiments in FIG. 1, by using multiple passivation layers 12a, 12b and 12c with decreasing uniformities as the passivation layer being far away from the circuit layer 10, the warpage or crack issue can be eliminated or mitigated. In some embodiments, there may be N passivation layers with decreasing uniformities as the passivation layer being far away from the circuit layer 10, where N is equal to or greater than 2.

The passivation layer 12d is disposed on the surface 12c1 of the passivation layer 12c. In some embodiments, the uniformity of the passivation layer 12d is equal to or greater than that of the passivation layer 12c. The passivation layer 12d has one or more recesses (or cavities) to expose the conductive pillar 13 for providing electrical connections. For example, a conductive layer 14r is disposed on a surface 12d1 of the passivation layer 12d and expends within the recesses of the passivation layer 12d to be electrically connected to the exposed portion of the conductive pillar 13. There are also one or more recesses (cavities) penetrating the passivation layer 12d, the passivation layer 12c and the passivation layer 12b to expose electrical contacts on the active surface 111 of the electronic component 11. The conductive layer 14r also expends within the recesses of the passivation layer 12d, the passivation layer 12c and the passivation layer 12b to form a conductive via 12v electrically connected to the electrical contacts of the electronic component 11. In some embodiments, a L/S of the conductive layer 14r is equal to or less than 2 μm/2 μm.

The protection layer 14 is disposed on the surface 12d1 of the passivation layer 12d. In some embodiments, the protection layer 14 may extend within the recesses of the passivation layer 12d and/or the recesses of the passivation layer 12d, the passivation layer 12c and the passivation layer 12b. In some embodiments, the protection layer 14 may include a solder mask, a dielectric layer, a passivation layer, a molding compound and any other suitable materials. The protection layer 14 has one or more recesses to expose a portion of the conductive layer 14r. The electrical contact 15 electrically the exposed portion of the conductive layer 14r. In some embodiments, the electrical contact 15 is a Controlled Collapse Chip Connection (C4) bump, a Ball Grid Array (BGA) or a Land Grid Array (LGA). In some embodiments, the electrical contact 15 can be used for a fan-in structure, a fan-out structure or a combination of the fan-in and fan-out structure. In some embodiments, there may be any number of conductive layers within the protection layer depending on design specifications.

Figure 2:
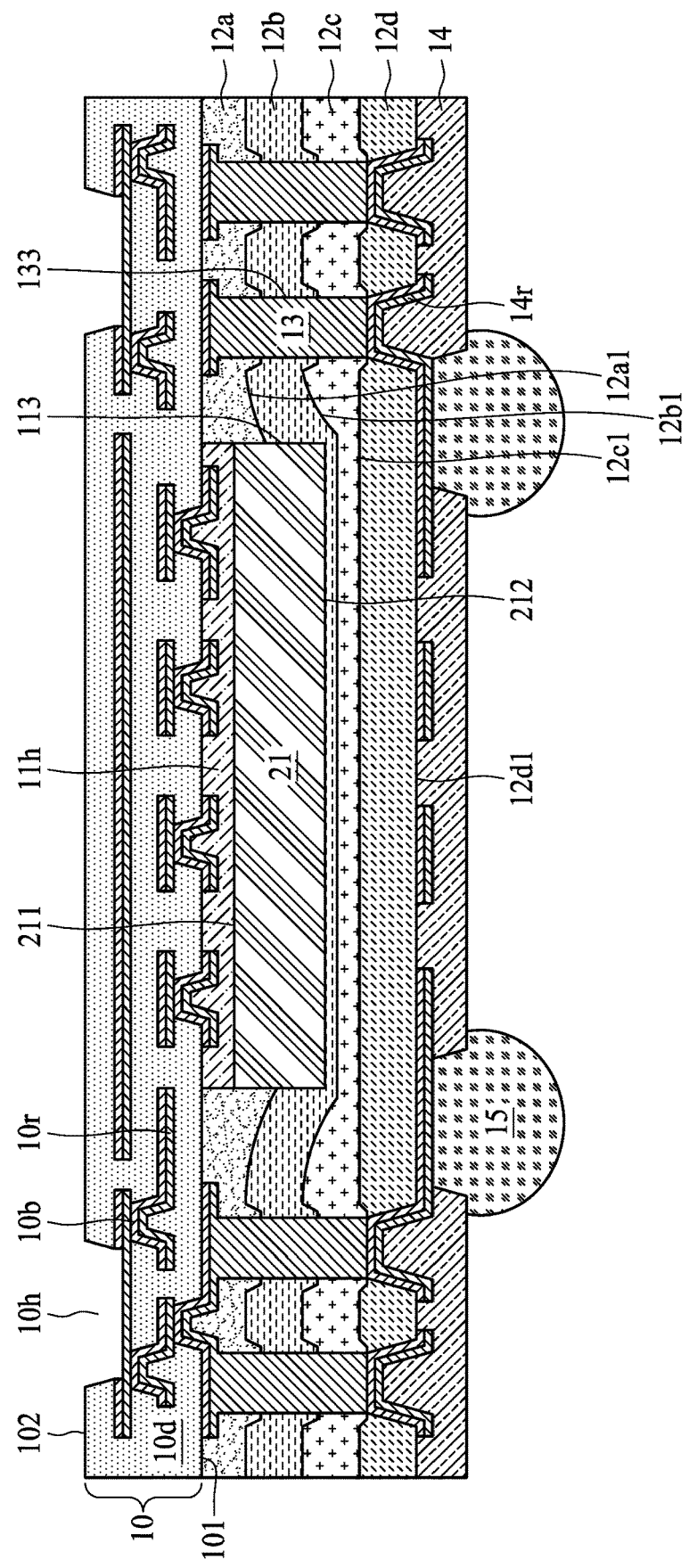
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1 except that in FIG. 1, the active surface 111 of the electronic component 11 faces away the circuit layer 10 while in FIG. 2, an active surface 211 of the electronic component 21 faces toward the circuit layer 10. The electronic component 21 is electrically connected to the conductive layer 10r exposed from the dielectric layer 10d of the circuit layer 10. In some embodiments, the semiconductor device package 1 may be formed by a chip-first process, whereas the semiconductor device package 2 may be formed by a chip-last process.

Figure 3:
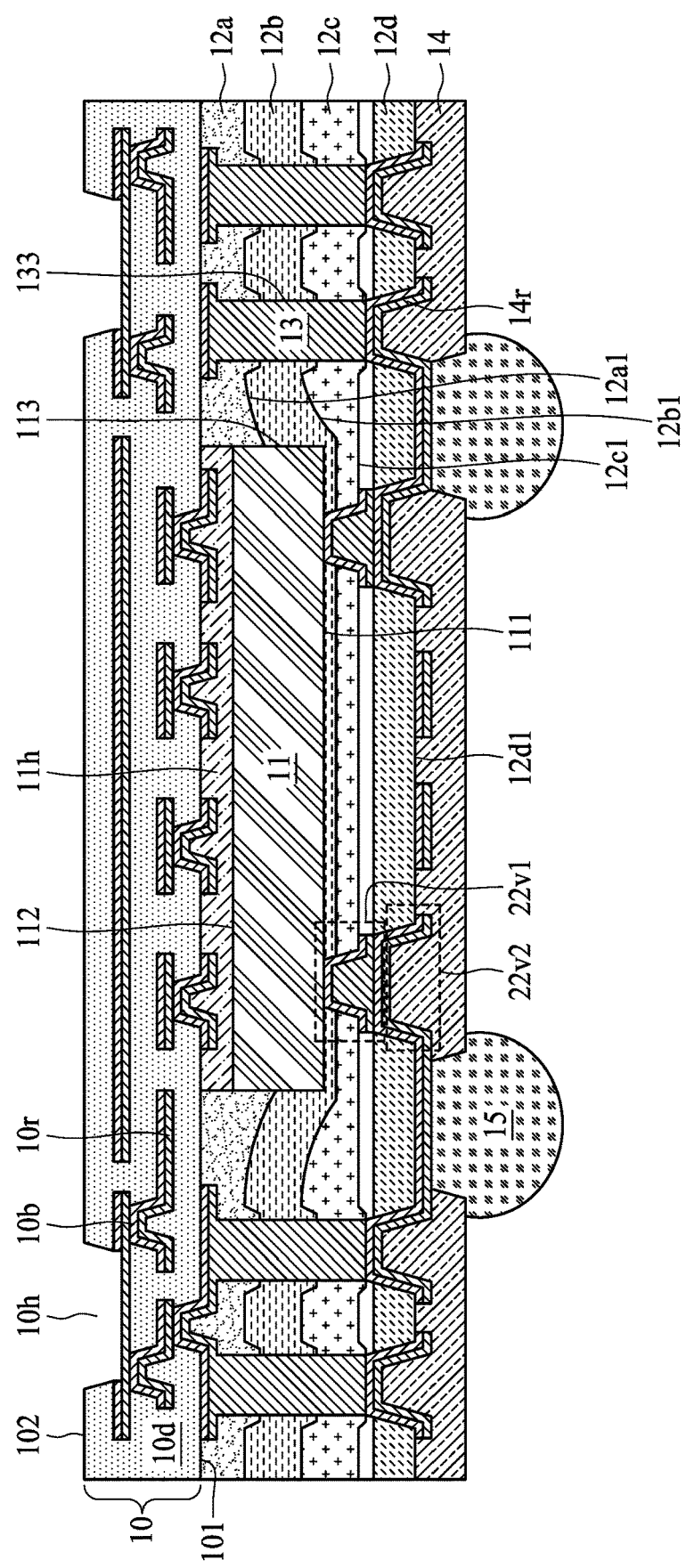
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1 except that the conductive via 12v of the semiconductor device package includes a ladder-shape conductive structure while a conductive via of the semiconductor device package 2 includes two conductive structures 22v1 and 22v2 arranged in a stack structure. For example, the conductive structure 22v1 is disposed on the conductive structure 22v2 to define the conductive via.

Figure 4A:
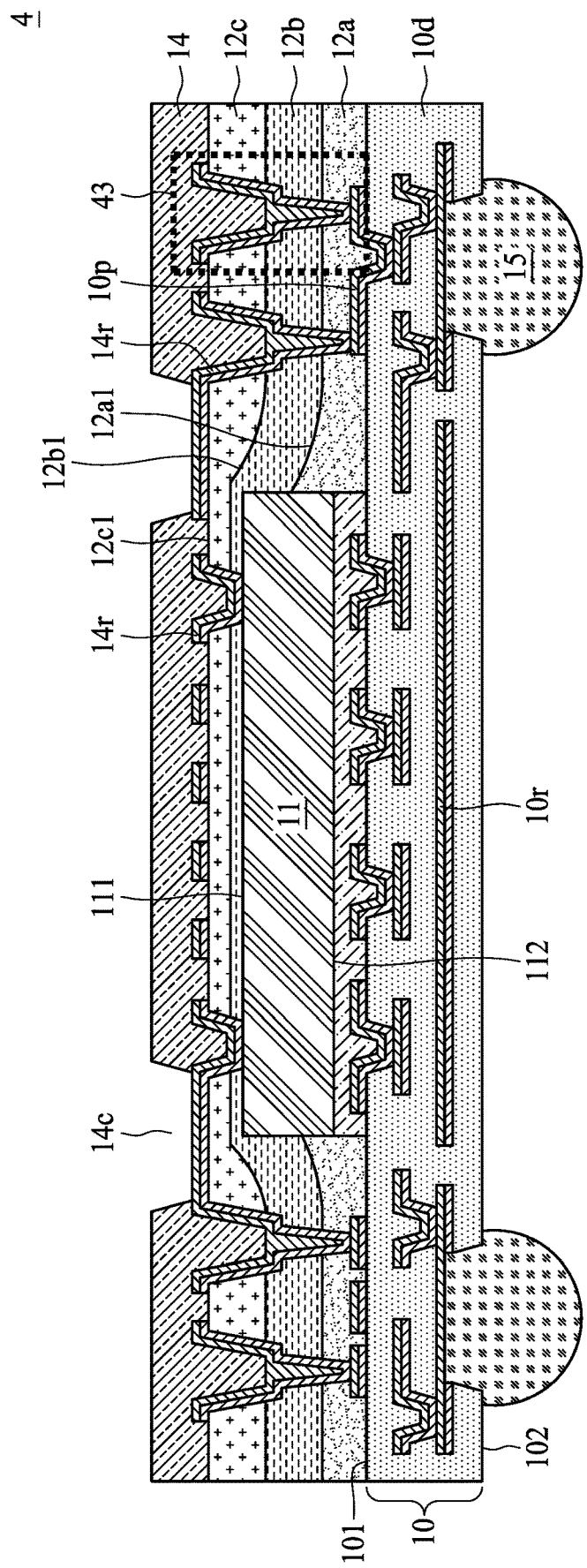
FIG. 4A illustrates a cross-sectional view of a semiconductor device package in accordance with some embodiments of the present disclosure.

FIG. 4A illustrates a cross-sectional view of a semiconductor device package 4 in accordance with some embodiments of the present disclosure. The semiconductor device package 4 is similar to the semiconductor device package 1 in FIG. 1, and one of the differences therebetween includes that a conductive pillar 43 of the semiconductor device package 4 is different from the conductive pillar 13 of the semiconductor device package 1.

Figure 4B:
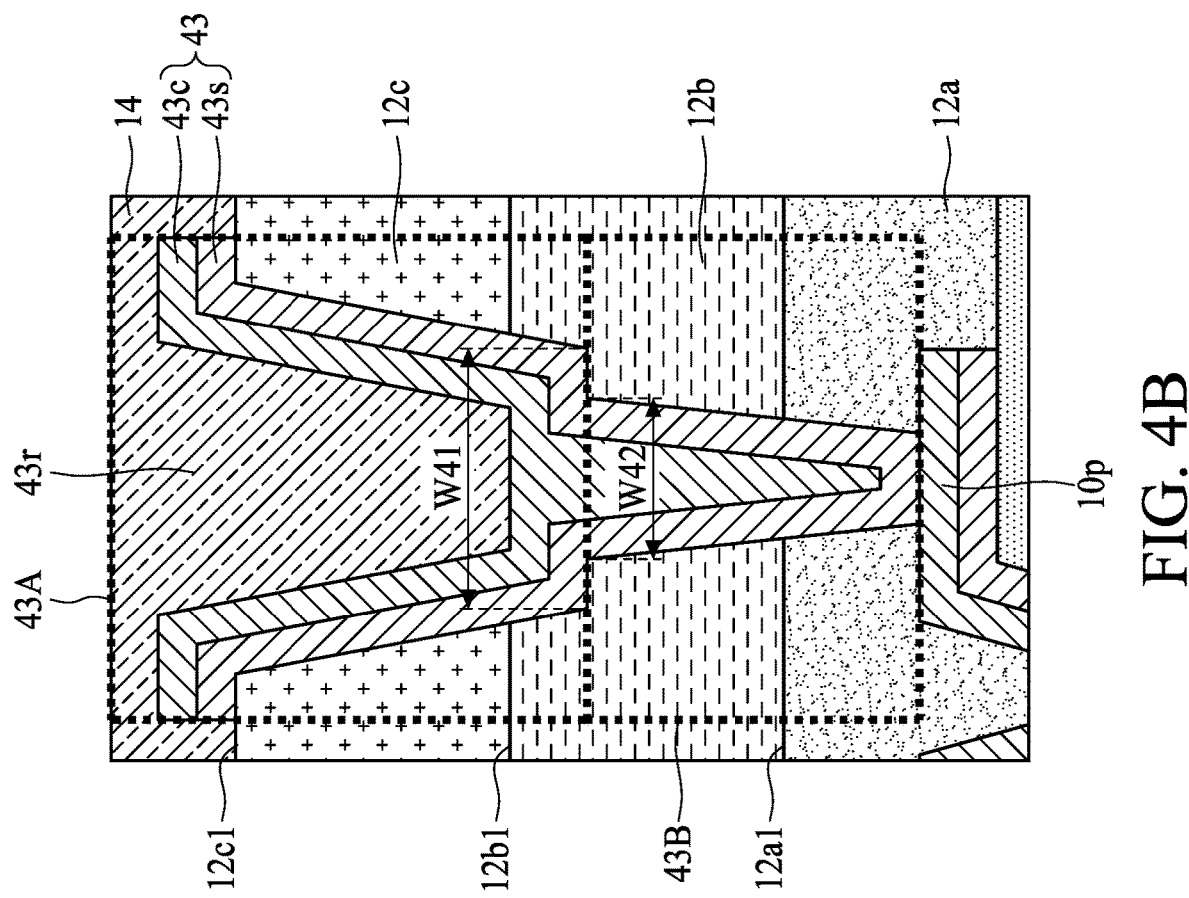
FIG. 4B illustrates an enlarged view of a portion of the semiconductor device package of FIG. 4A in accordance with some embodiments of the present disclosure.

As shown in FIG. 4B, which illustrates an enlarged view of the conductive pillar 43 in FIG. 4A, the conductive pillar 43 may include a portion 43A and a portion 43B. In some embodiments, the portion 43B extends within the passivation layer 12a and the passivation layer 12b. For example, the portion 43B of the conductive pillar 43 is covered or encapsulated by the passivation layer 12a and the passivation layer 12b. The portion 43B of the conductive pillar 43 is electrically connected to a conductive pad 10p on the circuit layer 10. The portion 43A of the conductive pillar 43 is disposed on the portion 43B and electrically connected to the portion 43B. In some embodiments, the portion 43A of the conductive pillar 43 extends from the surface 12c1 of the passivation layer 12c to the passivation layer 12b. For example, the portion 43A of the conductive pillar 43 is covered or encapsulated by the protection layer 14, the passivation layer 12c and the passivation layer 12b.

In some embodiments, the passivation layer 12a, the passivation layer 12b and the passivation layer 12c may define a recess in which the conductive pillar 43 is disposed. For example, the portion 43B of the conductive pillar 43 is disposed within the recess defined by the passivation layer 12a and the passivation layer 12b, and the portion 43A of the conductive pillar 43 is disposed within the recess defined by the passivation layer 12c and the passivation layer 12b. The conductive pillar 43 may include a seed layer 43s disposed on the surface 12c1 of the passivation layer 12c and extending along sidewalls of the recess defined by the passivation layer 12c, the passivation layer 12b and the passivation layer 12a to be electrically connected to the conductive pad 10p of the circuit layer 10. The conductive pillar 43 may include a conductive layer 43c disposed on the seed layer 12s. In some embodiments, the conductive pillar 43 may define a recess 43r (or cavity) and a portion of the protection layer 14 may be disposed within the recess 43r.

In some embodiments, a boundary between the portion 43A and the portion 43B of the conductive pillar 43 is within the passivation layer 12b. In other embodiments, a boundary between the portion 43A and the portion 43B of the conductive pillar 43 may be within the passivation layer 12a or the passivation layer 12c depending on different design specifications. In some embodiments, a width W41 of the portion 43A of the conductive pillar 43 is greater than a width W42 of the portion 43B of the conductive pillar 43.

FIGS. 5A, 5B, 5C, 5D, 5E, 5F, 5G and 5H are cross-sectional views of a semiconductor structure fabricated at various stages, in accordance with some embodiments of the present disclosure. Various figures have been simplified for a better understanding of the aspects of the present disclosure.

Figure 5A:
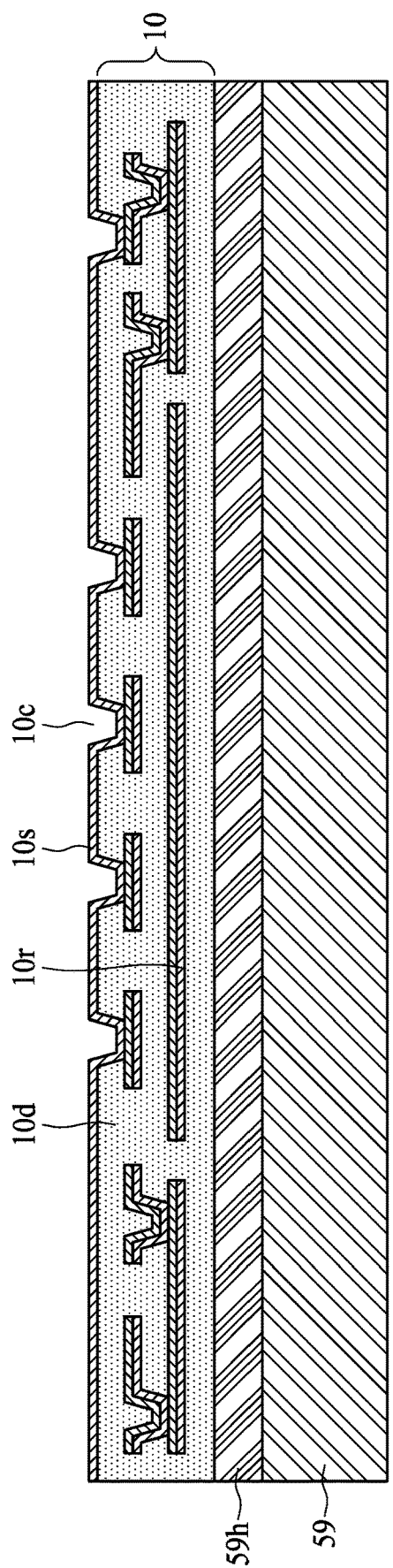
FIG. 5A, FIG. 5B, FIG. 5C, FIG. 5D, FIG. 5E, FIG. 5F, FIG. 5G and FIG. 5H illustrate a method of manufacturing a semiconductor device package in accordance with some embodiments of the present disclosure.

Referring to FIG. 5A, a carrier 59 is provided and an adhesive layer (or release film) 59h is disposed on the carrier 59. A circuit layer 10 is then formed on the adhesive layer 59h. In some embodiments, the circuit layer 10 can be formed by lithographic process. For example, the circuit layer 10 may be formed by the following operations: (i) disposing a dielectric layer (or a passivation layer) 10d on the adhesive layer 59h by, for example, coating; and (ii) forming a conductive layer 10r (e.g., RDL) within the dielectric layer 10d by, for example, exposing and/or developing process. One or more openings or cavities 10c are formed on the dielectric layer 10d to expose a portion of the conductive layer 10r. A seed layer 10s is then formed on the dielectric layer 10d and extends within the cavities 10c.

Figure 5B:
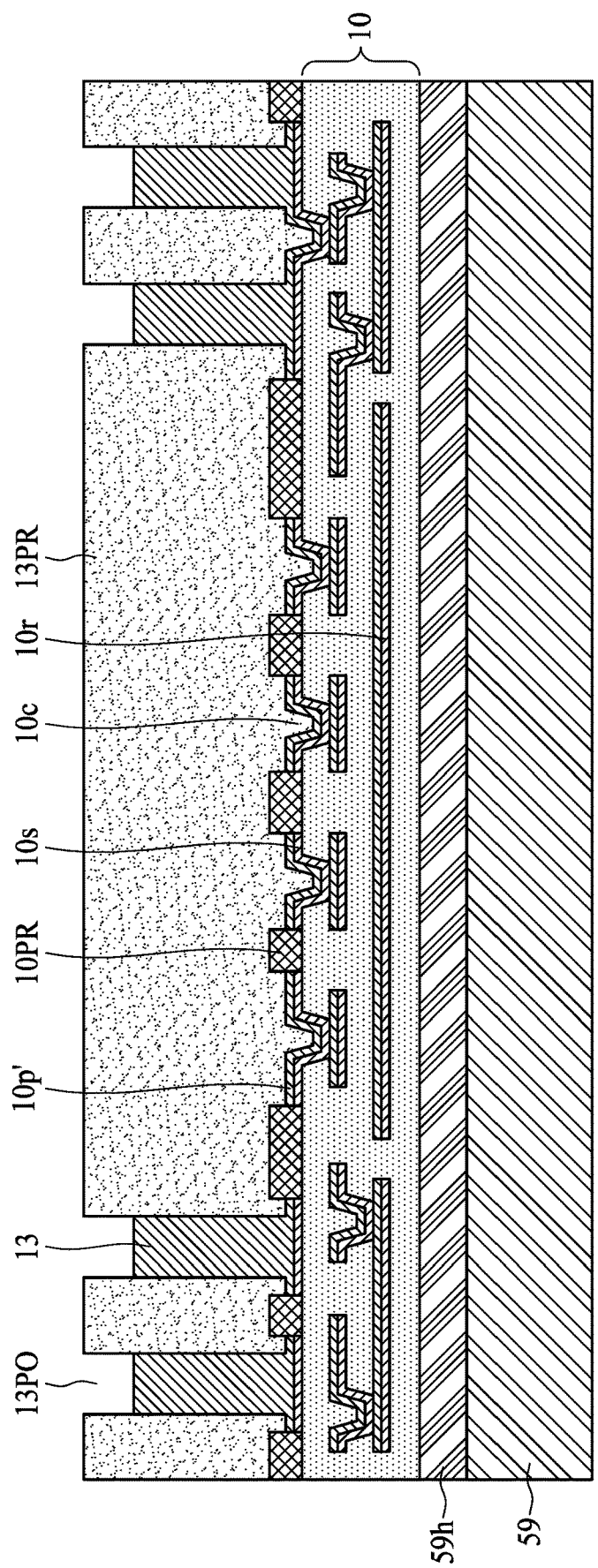

Referring to FIG. 5B, a photoresist film (mask) is formed on the seed layer 10s and a lithographic process is carried out to form a patterned photoresist film 10PR to cover a portion of the seed layer 10s. A conductive layer 10p' is formed on the seed layer 10s that is exposed from the patterned photoresist film 10PR. In some embodiments, the conductive layer 10p' can be formed by, for example, plating. A photoresist film 13PR is disposed on the conductive layer 10p' by, for example, coating. One or more openings 13PO are formed to penetrate the photoresist film 13PR to expose a portion of the conductive layer 10p'. In some embodiments, the opening 13PO can be formed by lithographic processes. A metal material is then disposed within the opening 13PO to form a conductive pillar 13 by, for example, plating.

Figure 5C:
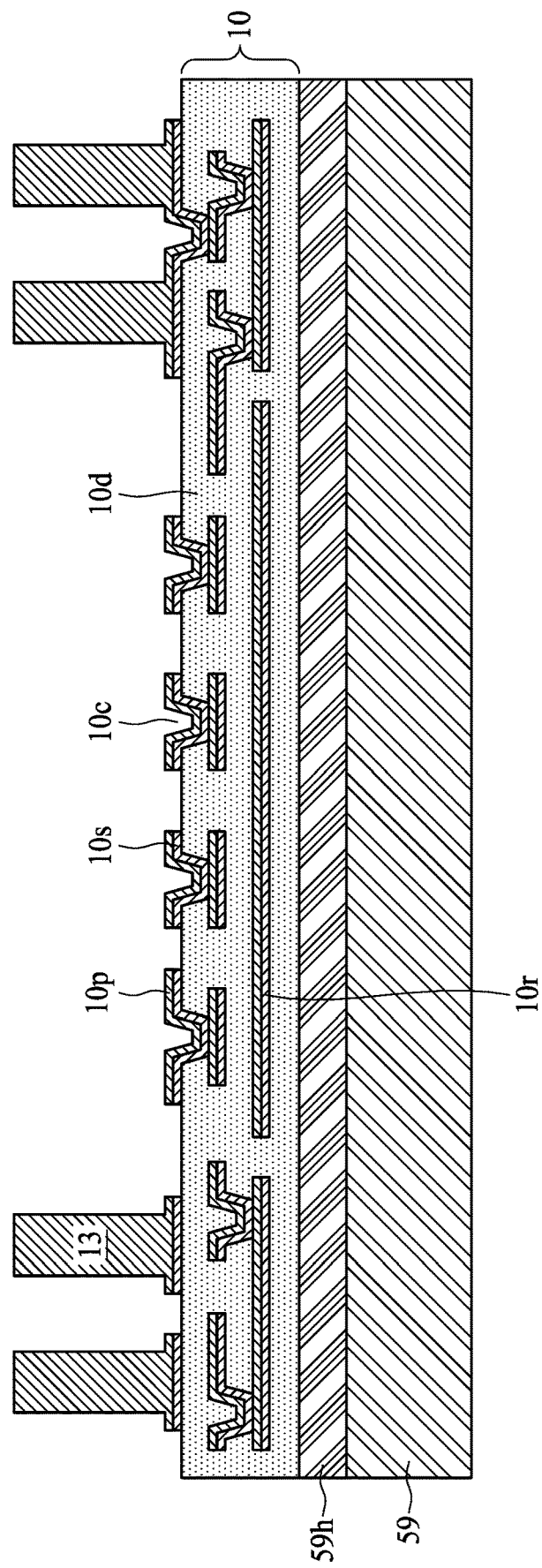

Referring to FIG. 5C, the photoresist film 13PR is removed to expose the conductive layer 10p' and the conductive pillar 13. The photoresist film 10PR and a portion of the seed layer 10s covered by the photoresist film 10PR are then removed to form the conductive pad 10p. In some embodiments, the photoresist film 10PR and/or the seed layer 10s can be removed by etching or other suitable processes.

Figure 5D:
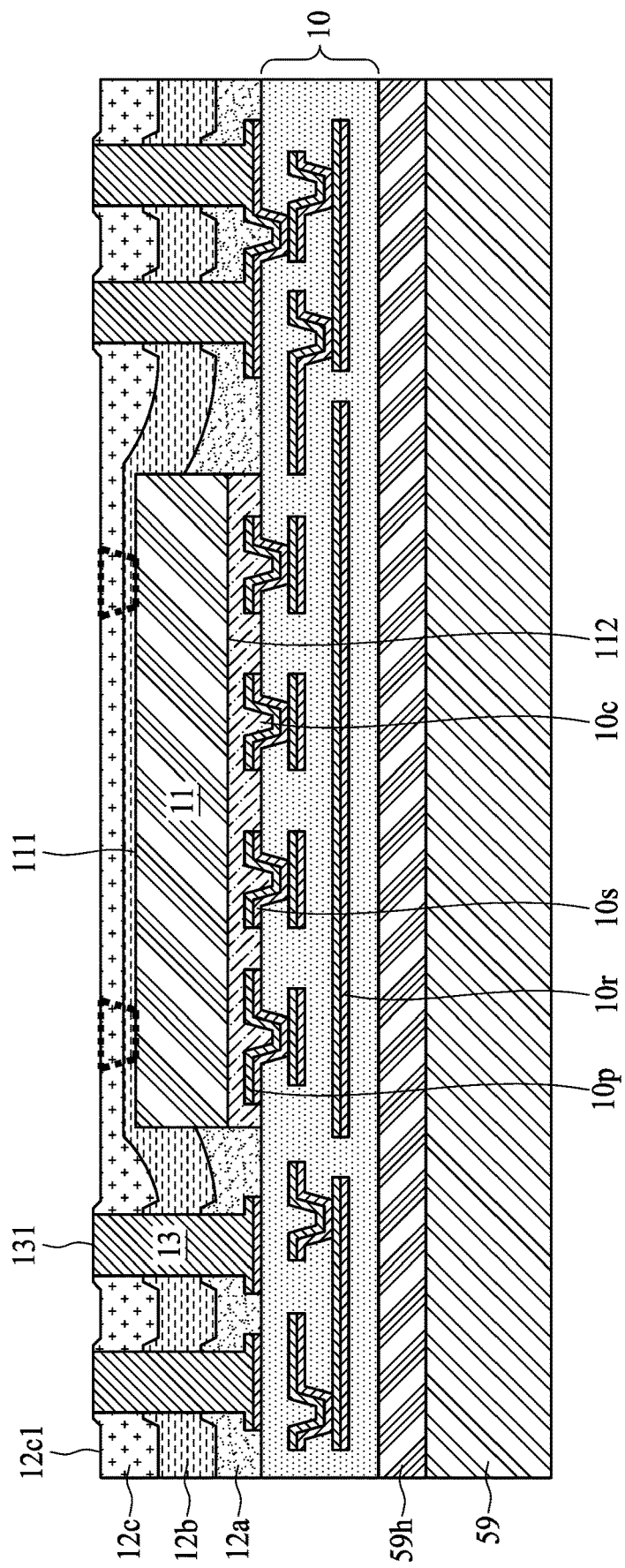

Referring to FIG. 5D, the backside surface 112 of the electronic component 11 is attached to the circuit layer 10 through an adhesive layer. In some embodiments, a curing operation may be performed. The passivation layer 12a, the passivation layer 12b and the passivation layer 12c are then formed on the circuit layer 10 in sequence. In some embodiments, the passivation layer 12a, the passivation layer 12b and the passivation layer 12c are formed by coating or other suitable processes. In some embodiments, the surface 12c1 of the passivation layer 12c is substantially coplanar with the surface 131 of the conductive pillar 13. In other embodiments, the surface 12c1 of the passivation layer 12c can be higher or lower than the surface 131 of the conductive pillar 13. A lithographic process (e.g., an exposing process) is then performed on a portion of the passivation layer 12c and the passivation layer 12b that is over the active surface 111 of the electronic component 11 as marked by dotted-line rectangles in FIG. 5D.

Figure 5E:
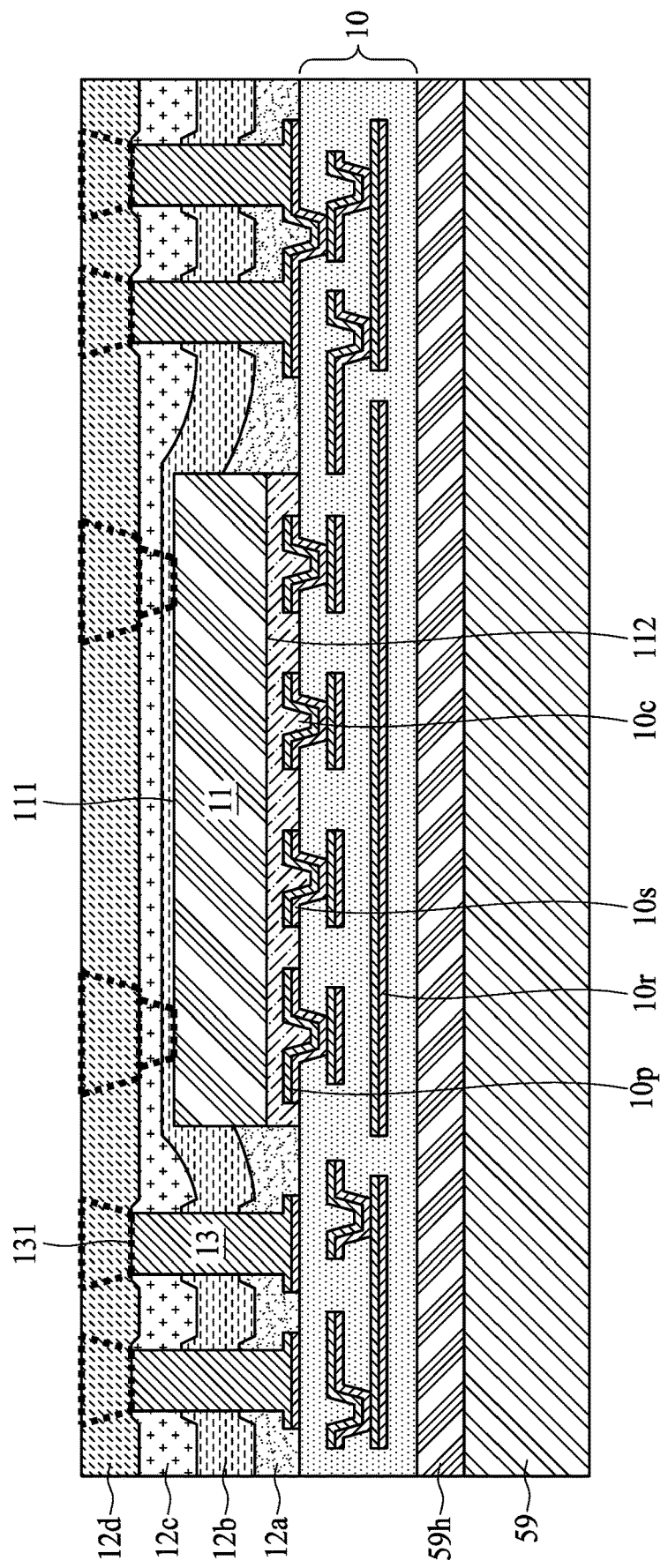

Referring to FIG. 5E, the passivation layer 12d is formed on the passivation layer 12c by, for example, coating or other suitable processes. A lithographic process (e.g., an exposure process) is then performed on a portion of the passivation layer 12d that is over the active surface 111 of the electronic component 11 and the conductive pillar 13 as marked by dotted-line rectangles in FIG. 5E.

Figure 5F:
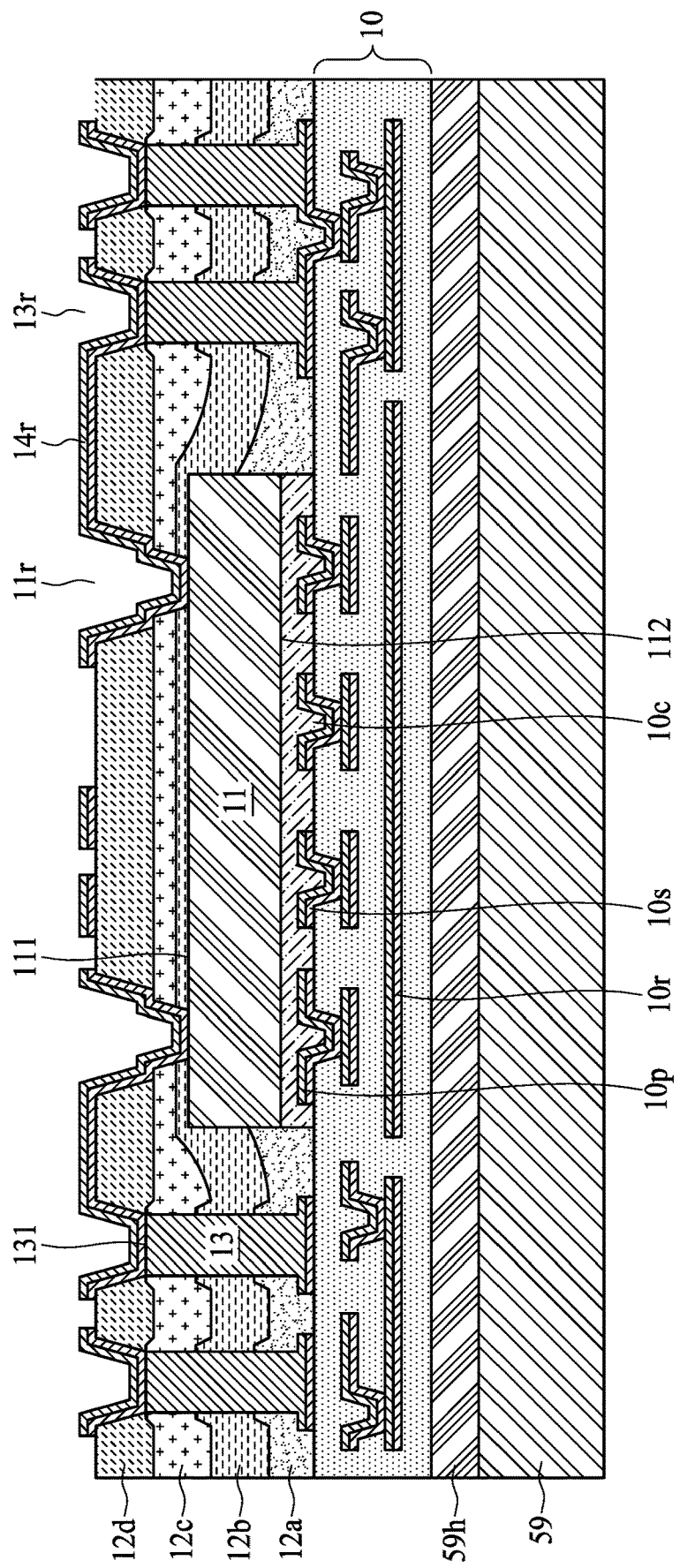

Referring to FIG. 5F, a portion of the passivation layer 12d, the passivation layer 12c and the passivation layer 12b where the exposing process is performed thereon during the operations in FIGS. 5D and 5E is removed to form the cavities 13r and 11r to respectively expose the surface 131 of the conductive pillar 13 and the active surface 111 of the electronic component 11. A patterned conductive layer 14r is then formed on the passivation layer 13d and within the cavities 13r and 11r to be electrically connected to the conductive pillar 13 and the electronic component 11. In some embodiments, the patterned conductive layer 14 can be formed by lithographic processes (e.g., exposing operation, developing operation, plating operation, removing operation and the like).

In some other embodiments, a molding compound is formed to cover the chip/die and the conductive pillars, and thus a grinding process should be carried out to remove a portion of the molding compound to expose the conductive pillars and the chip/die for electrical connections. However, the grinding process would increase the time and cost for manufacturing the semiconductor device package. In some embodiments as shown in FIGS. 5D, 5E and 5F, since the passivation layer 13b, the passivation layer 13c and the passivation layer 13d are formed of photosensitive materials, a portion of the passivation layer 12d, the passivation layer 12c and the passivation layer 12b can be removed to expose the conductive pillar 13 and the electronic component 11 by lithographic processes (e.g., exposing operation, developing operation, etching operation and the like). Therefore, no grinding process is required, which would reduce the time and cost for manufacturing the semiconductor device package.

Figure 5G:
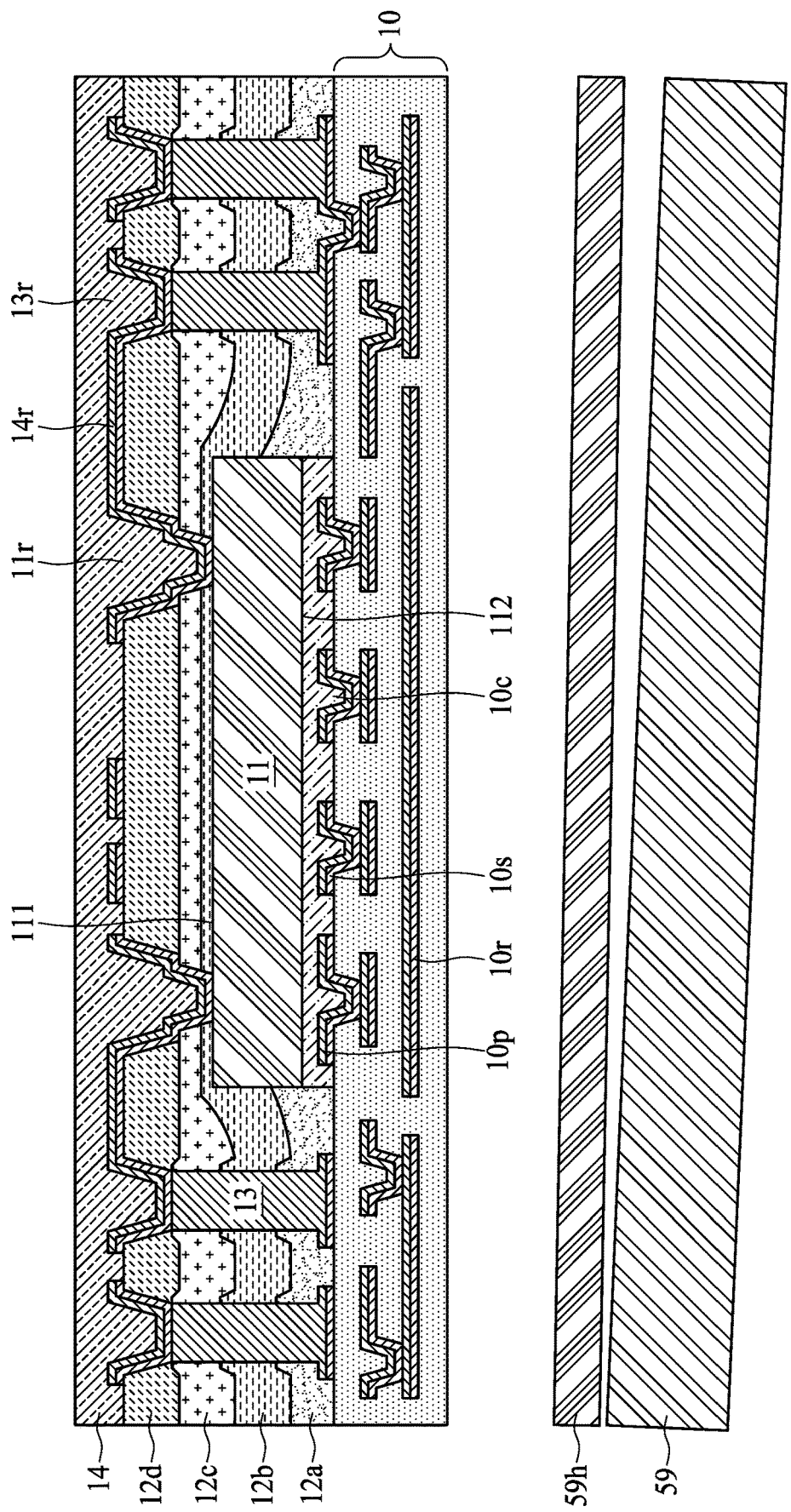

Referring to FIG. 5G, the protection layer 14 is formed on the passivation layer 12d to cove the passivation layer 12d and the conductive layer 14r. In some embodiments, the protection layer 12d can be formed by coating. In some embodiments, a curing operation may be performed after the formation of the protection layer 12d. The carrier 59 and the adhesive layer 59h are then removed from the circuit layer 10.

Figure 5H:
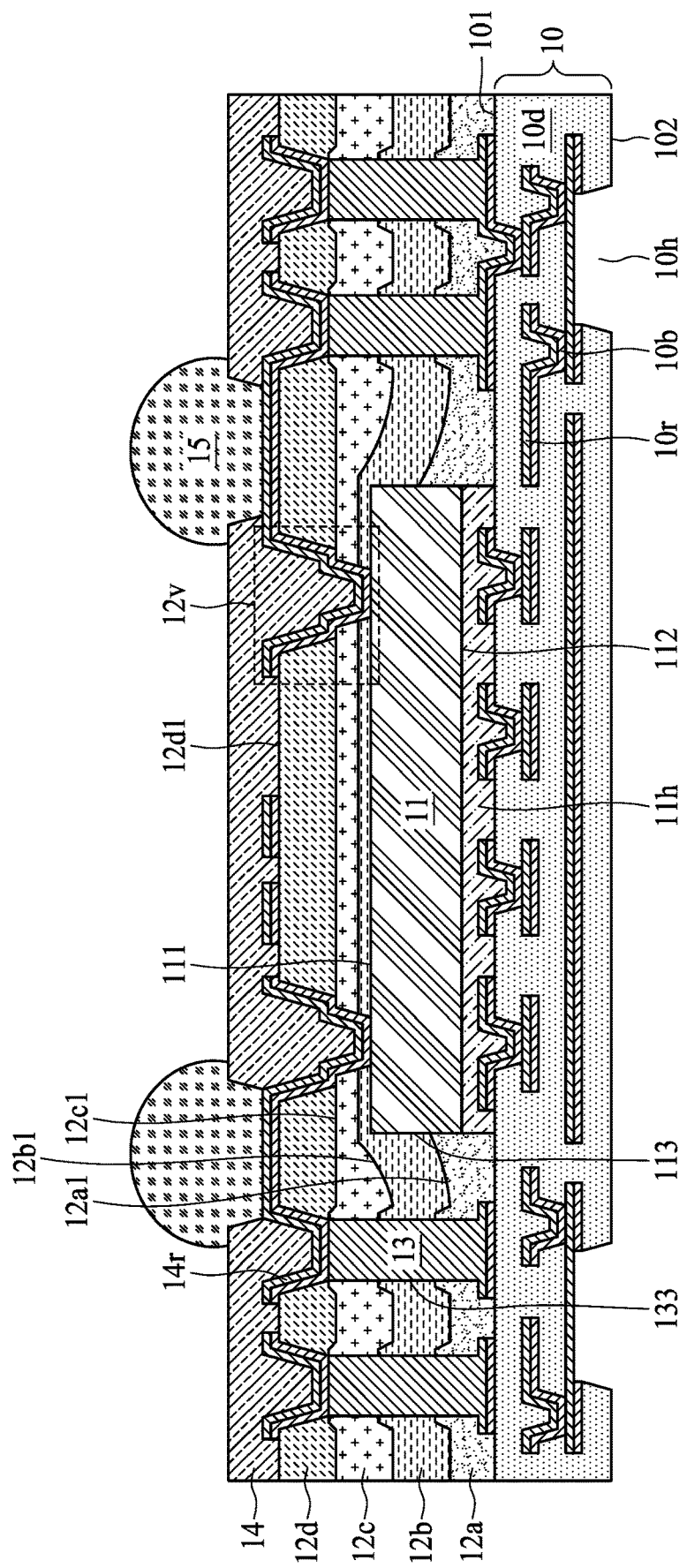

Referring to FIG. 5H, one or more openings are formed on the protection layer 14 and the dielectric layer 10d to expose a portion of the conductive layer 14r and the conductive layer 10r respectively. In some embodiments, the openings can be formed by drilling, etching or other suitable processes. Electrical contacts 15 (e.g., bumps or solder balls) are formed within the openings of the protection layer 14 to be electrically connected to the conductive layer 14r. In some embodiments, the electrical contacts 15 are C4 bumps, BGA or LGA. In some embodiments, the electrical contacts 15 can be formed by, e.g., electroplating, electroless plating, sputtering, paste printing, bumping or bonding process. In some embodiments, the semiconductor device package shown in FIG. 5H is substantially the same as or similar to the semiconductor device package 1 shown in FIG. 1. In other embodiments, the operations shown in FIGS. 5A, 5B, 5C, 5D, 5E, 5F, 5G and 5H can be performed to form the semiconductor device package 2, 3 or 4 in FIG. 2, 3 or 4A.

Figure 6B:
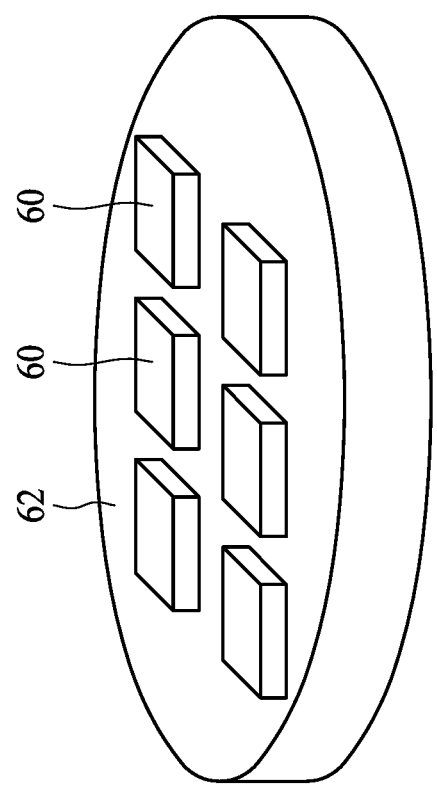
FIG. 6B illustrates various types of semiconductor device packages in accordance with some embodiments of the present disclosure.
Figure 6A:
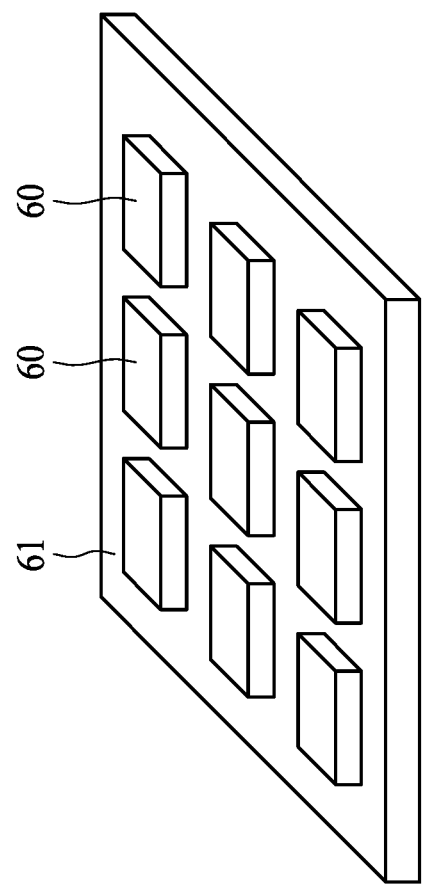
FIG. 6A illustrates various types of semiconductor device packages in accordance with some embodiments of the present disclosure.

FIGS. 6A and 6B illustrate different types of semiconductor device packages in accordance with some embodiments of the present disclosure.

As shown in FIG. 6A, a plurality of chips 60 and/or dies are placed on a square-shaped carrier 61. In some embodiments, at least one of the chips 60 may include the semiconductor device package 1, 2, 3 or 4 as show in FIG. 1, 2 3 or 4A. In some embodiments, the carrier 61 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As shown in FIG. 6B, a plurality of chips 60 and/or dies are placed on a circle-shaped carrier 62. In some embodiments, at least one of the chips 60 may include the semiconductor device package 1, 2, 3 or 4 as show in FIG. 1, 2 3 or 4A. In some embodiments, the carrier 62 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a circuit layer having a first surface;
   an electronic component disposed on the first surface of the circuit layer;
   a first passivation layer disposed on the first surface of the circuit layer, the first passivation layer having a first surface facing away the circuit layer;
   a second passivation layer disposed on the first surface of the first passivation layer, the second passivation layer having a second surface facing away the circuit layer;
   a third passivation layer disposed on the second surface of the second passivation layer, wherein the third passivation layer having a third surface facing away the circuit layer, and the third surface of the third passivation layer is more even than the second surface of the second passivation layer; and
   a conductive layer disposed on the third surface of the third passivation layer and penetrating the second passivation layer and the third passivation layer to be electrically connected to a conductive pad of the electronic component, wherein the first surface of the first passivation layer is less even than the second surface of the second passivation layer.

2. The semiconductor device package of claim 1, wherein a liquid viscosity of the third passivation layer is in a range from about 1 Pa·s to about 4 Pa·s.

3. The semiconductor device package of claim 1, further comprising a conductive pillar disposed on the first surface of the circuit layer and adjacent to the electronic component.

4. The semiconductor device package of claim 3, wherein
the first passivation layer covers a portion of the conductive pillar;
the first passivation layer has a first portion adjacent to the conductive pillar and a second portion far away from the conductive pillar; and
a thickness of the first portion of the first passivation layer is greater than a thickness of the second portion of the first passivation layer.

5. The semiconductor device package of claim 3, wherein
the conductive pillar has a first portion covered by the first passivation layer and the second passivation layer; and
the conductive pillar has a second portion connected to the first portion of the conductive pillar and covered by the second passivation layer and the third passivation layer.

6. The semiconductor device package of claim 2, wherein a width of the first portion of the conductive pillar is less than a width of the second portion of the conductive pillar.

7. The semiconductor device package of claim 1, wherein a liquid viscosity of the first passivation layer is in a range from about 7 Pa·s to about 9 Pa·s.

8. The semiconductor device package of claim 1, wherein the first surface of the first passivation layer is at a lateral surface of the electronic component.

9. The semiconductor device package of claim 1, wherein the second surface of the second passivation layer covers an active surface of the electronic component.

10. The semiconductor device package of claim 1, wherein the first passivation layer and the second passivation layer include photosensitive materials.

11. The semiconductor device package of claim 1,
wherein a liquid viscosity of the second passivation layer is in a range from about 4 Pa·s to about 7 Pa·s.

12. The semiconductor device package of claim 1, wherein a liquid viscosity of the first passivation layer is greater than a liquid viscosity of the second passivation layer.

13. The semiconductor device package of claim 1, wherein a distance between the second surface of the second passivation layer and the first surface of the circuit layer is greater than the distance between an active surface of the electronic component and the first surface of the circuit layer.

* * * * *